United States Patent [19]

Scheingold et al.

[11] 3,877,064

[45] Apr. 8, 1975

[54] DEVICE FOR CONNECTING LEADLESS INTEGRATED CIRCUIT PACKAGES TO A PRINTED-CIRCUIT BOARD

[75] Inventors: William Samuel Scheingold, Audubon; Lawrence Purdy, Hummelstown; Frank Christian Youngfleish, Harrisburg, all of Pa.

[73] Assignee: AMP Incorporated, Harrisburg, Pa.

[22] Filed: Feb. 22, 1974

[21] Appl. No.: 445,045

[52] U.S. Cl. ....... 357/74; 174/DIG. 3; 317/101 CC; 339/17 CF; 324/158 F

[51] Int. Cl. ............................................ H01l 5/00

[58] Field of Search .......... 357/68, 74; 174/DIG. 3; 317/101 CC; 339/17 CF; 324/158 F

[56] References Cited

UNITED STATES PATENTS 3,757,271 9/1973 Judge et al. .................... 339/17 CF

*Primary Examiner*—Martin H. Edlow
*Assistant Examiner*—E. Wojciechowicz
*Attorney, Agent, or Firm*—Allan B. Osborne, Esq.

[57] ABSTRACT

This invention relates to a device which electrically connects a leadless integrated circuit package to a printed circuit board. More particularly, the device includes a square frame having a plurality of "S" shaped contacts arranged along each side of the housing. The lower end of the contact electrically engages a circuit on the printed circuit board and the upper end electrically engages a circuit on the package. The frame further contains positioning and support clips which permits alignment of the package before engagement is made with the S shaped contacts.

1 Claim, 5 Drawing Figures

DEVICE FOR CONNECTING LEADLESS INTEGRATED CIRCUIT PACKAGES TO A PRINTED-CIRCUIT BOARD

BACKGROUND OF THE INVENTION

With the development of integrated circuits the problem of connecting these circuits to circuits such as found on a printed circuit board without soldering, while yet establishing effective electrical contact between the circuits on the board and the integrated circuits have been attacked by many inventors. A number of patents have issued covering means for assembly a small integrated circuit to a testing apparatus and also to a printed circuit board without soldering but these means are not considered to be effective solutions of the problem. The greater problem of effectively engaging a large scale integrated circuit package to a printed circuit board without soldering appears to present such very considerable additional difficulties that an effective solution has evaded those working in the art.

Accordingly, the present invention provides a frame having a plurality of cavities along each side which receive and S shaped contact. The lower end of these S shaped contact engages a circuit on the printed circuit board. The upper end of the S shaped contact engages the pad on the substrate of the integrated circuit package. On each of the four corners of the frame, support clips are provided which permit the alignment of the integrated circuit package prior to electrical engagement with the upper end of the S shaped contact.

DESCRIPTION OF THE PREFERRED EMBODIMENT

Figure 1:
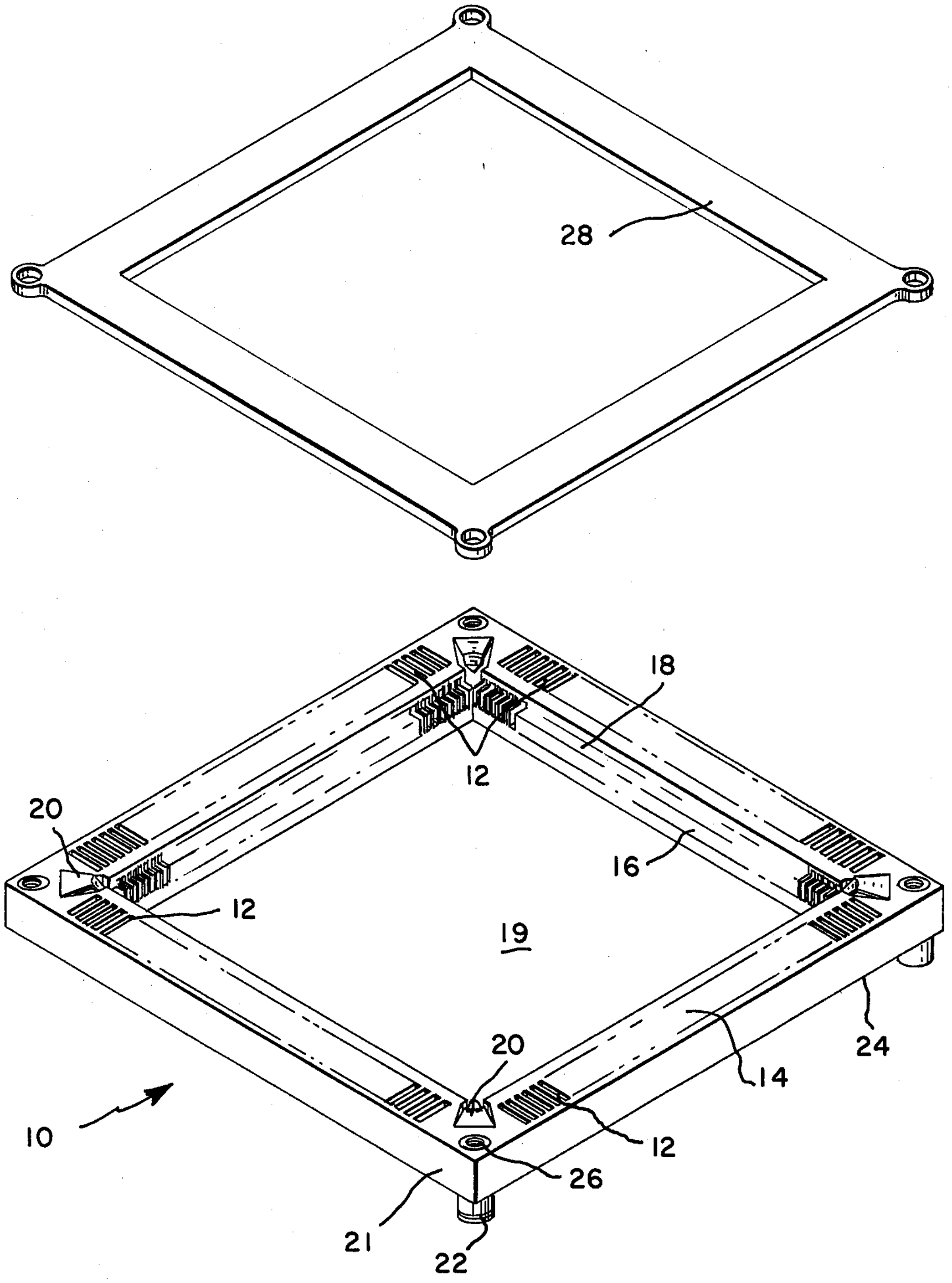
FIG. 1 is a view of the square frame which contains a plurality of contacts and which receives and supports the leadless integrated circuit package.

The frame 10 in FIG. 1 is molded from an insulating material such as nylon and contains 60 cavities 12 per side. Each cavity opens onto the upper surface 14, onto the inside surface 16 and onto the base 17 of the frame. The inside surface is built inwardly to provide a ledge 18. As is apparent, only a few of the 240 cavities 12 are shown on the frame. The leadless IC package (not shown) is received in the center opening 19 of the frame and is supported by alignment and support clips 20 found in each corner of the frame. Molded on the bottom of each corner 21 is a tubular portion 22 which extends downwardly beyond the base 24 of the frame. A mounting hole 26 extends from surface 14 through the tubular portion.

A bracket 28 is shown above the frame 10. This bracket secures the IC package to the frame and itself is secured to the frame via holes 30 which are in alignment with holes 26 in each corner 21.

Figure 2:
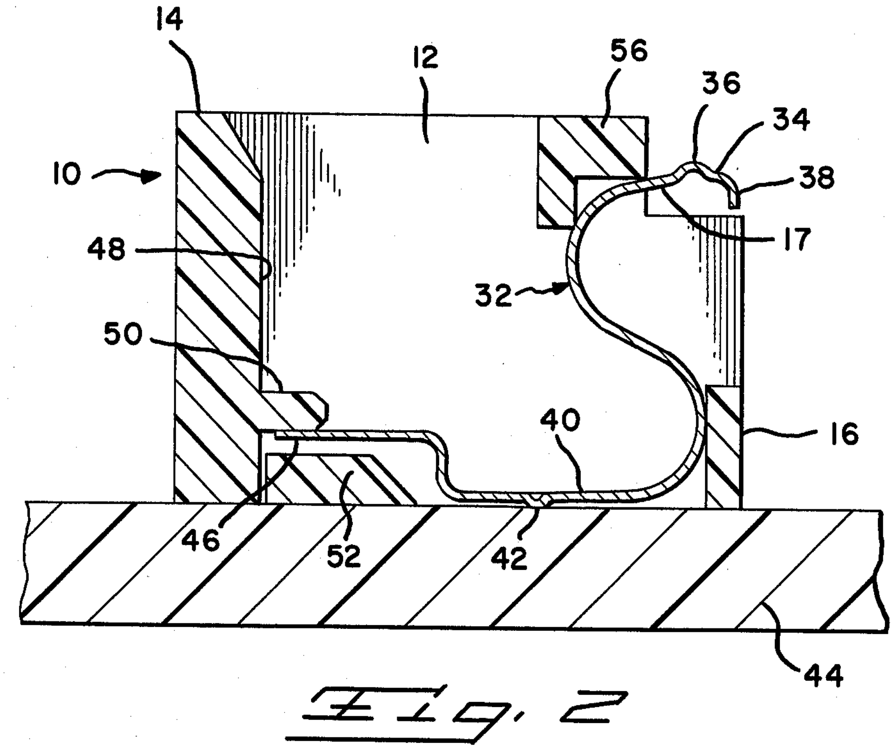
FIG. 2 shows one cavity in the frame of FIG. 1 and the S shaped contact contained in the cavity.

FIG. 2 shows the detail of both a cavity 12 and S shaped contact 32.

The contact 32 has a nose 34 on which is a dimple which provides contact point 36. The contact tip 38 is turned downward to prevent accidental catching of and damage to the nose and contact point.

The contact 32 is bent into two curves, one opposite to the other to provide the S shape in the main part of the contact. This S curve permits large deflective capability with reasonable load and stress levels.

At the lower end of the S curve is a flattened portion 40 on which is a dimple which provides the second contact point 42. This point engages the pad (not shown) on the printed circuit board 44.

A tail 46 extends beyond and is displaced from the second contact point 42. In addition to holding the contact 32 in the cavity 12, the tail permits test probing when the IC package is in place in frame 10.

The outside wall 48 of cavity 12 contains a tail retaining stud 50. A rib 52 traverses cavity 12 and acts to limit downward travel of the contact and also cooperates in retaining the contact in the cavity. A portion of the inside surface 16 also helps to captivate the contact as does the portion of the upper surface 14, designated by the reference numeral 56.

As shown in FIG. 2, contact 32 is retained within cavity 12 by the engaging surface of the S curve, the contact nose 34, tail 46 and the aforementioned parts of the cavity. No other securing means are required in this novel frame.

Figure 3:
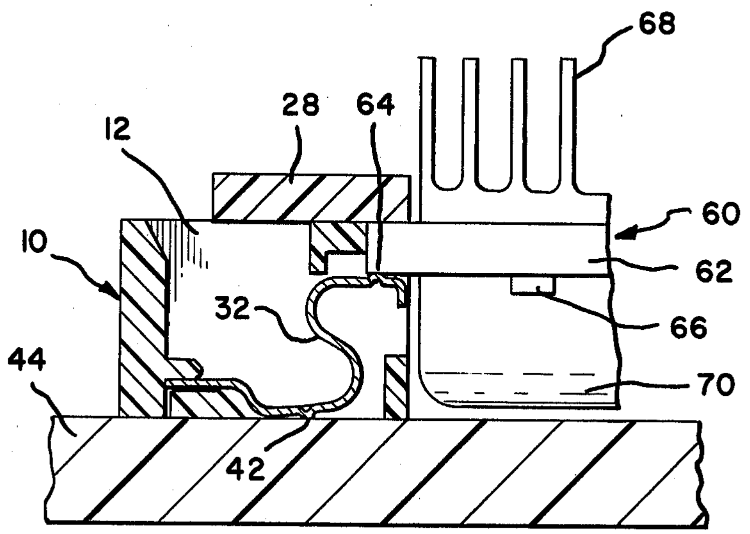
FIG. 3 shows the view of FIG. 2 with a portion of the leadless integrated circuit package positioned in the frame.

FIG. 3 is FIG. 2 but with a IC package 60 shown in place within the frame. The package consists of a substrate 62 on which are deposited or otherwise fixed pads, whose location is indicated by reference numeral 64, integrated circuit chips 66 and conductors (not shown), which lead from the pads to the chips. Above the substrate 60 is a heat sink 68 and below is a cover 70 which protects the chips.

With the IC package 60 in place, the upper contact point 36 abuts against pad 64 on the substrate. The contact configuration; i.e., the S curve, provides wiping action between the pad and the contact point as the IC package is being placed into the frame. Obviously the wiping action improves the electrical contact between the two. Further, as the IC package is being placed in position the contact 32 will rock about lower contact point 42. This rocking action results in a small amount of wiping action which enhances the electrical contact between lower contact point 42 and the pad (not shown) on printed circuit board 44.

FIG. 3 also shows bracket 28 in place which, as noted above, secures the IC package 60 to the frame.

Figure 4:
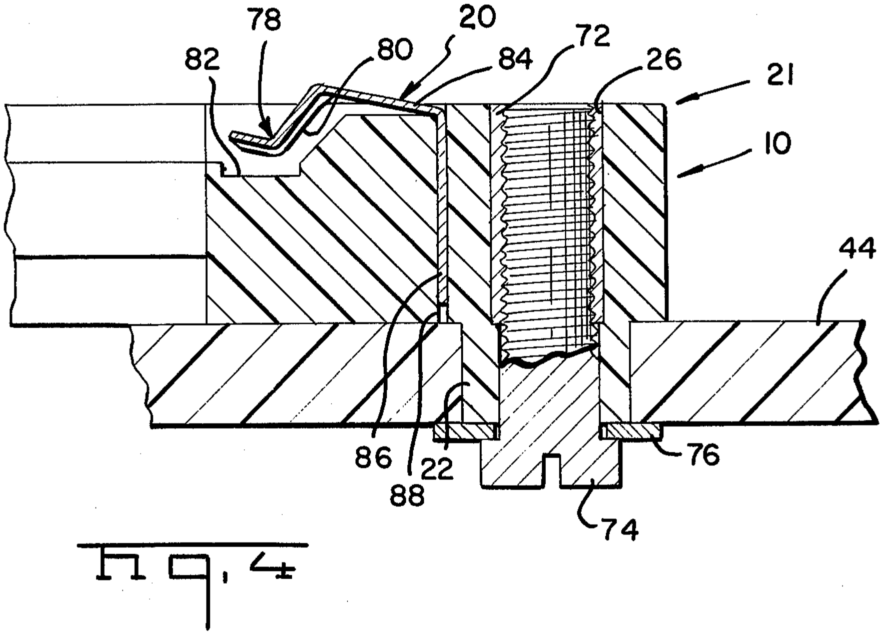
FIG. 4 is a cross-section view of a corner of the frame of FIG. 1 showing the alignment and support clip.

FIG. 4 shows the details of mounting holes 26 and support clip 20.

A metal internally threaded insert 72 is positioned in each hole 26 to receive threaded bolts 74 which engages the insert from the bottom of printed circuit board 44. An oversize washer 76 spans tubular portion 22 of the frame and engages the board.

Support clip 20, made from stainless steel, has an L-shaped support platform 78. The middle part of the platform is indented to provide a centering point for an edge of the IC package 60. The outward expression of the indent is shown by reference numeral 80.

As FIG. 4 shows, a recess 82 is molded into frame 10 at each corner to receive the support platform when biased thereinto by the IC package.

A short bight 84 connects platform 78 with an elongated leg 86 which is pushed into slot 88 in corner 21. The size of the slot is such that the leg is held therein frictionally.

It is important to note that FIG. 4 shows the configuration of support clip 20 in its unstressed position; i.e., support platform 78 is canted at about 120° relative to leg 86.

Figure 5:
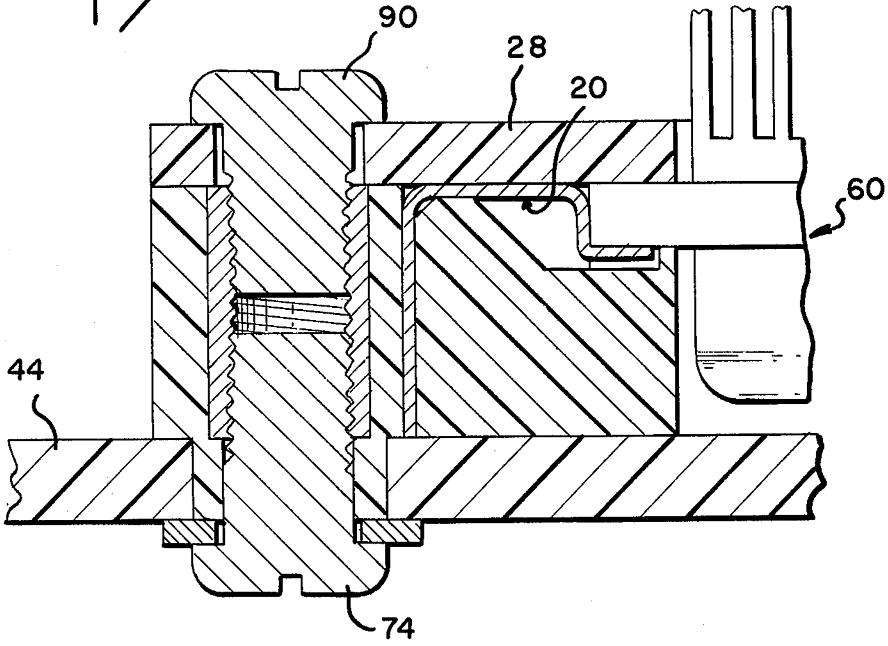
FIG. 5 shows the corner of the frame of FIG. 4 with the leadless integrated circuit package in place.

FIG. 5 shows the corner 21 of FIG. 4 after an IC package has been secured to the frame 10.

Due to the cant in support platform 78, IC package 60 will be aligned with the frame perfectly before contact with contacts 32 are made. With the corners of the package positioned in the indent, the bracket 28 is placed on top and bolts 90 inserted. As the bolts are threaded down and the package approached ledge 18, the above noted wiping actions takes place.

The above described embodiment may be modified in several respects. For example, the tubular portions 22 can be eliminated from two corners 21 and one portion 22 remaining can be shaped into a diamond shape.

With the combination of the round and diamond tubular portions, correct alignment and pad-contact point matching is achieved. This is because the round tubular portion — round hole combination gives positional location and the diamond portion — round hole combination gives angular location.

With reference to the IC package indexing, one slot 88 and thus a support clip 20 can be moved in closer to opening 19 so that it exerts a biasing force on the IC package and pushes the opposite corner into the datum corner of the frame 10.

The present invention has many novel features. For example, the S shaped contact meets launch requirements for high speed signal transmission. Further, the shape permits large deflective capability with reasonable load and stress levels. Also the S shaped curve minimizes inductance effects.

Although many conductive metals may be used, heat treated beryllium copper contacts 32 withstand operating and storage termperatures without stress relaxation or creep.

Another novel feature is that the cavity opening and contact tail 46 permit test probing with the IC package secured in the frame 10.

The dimpled-contact points 36 and 42 stiffens the contact 32 and provides a localized contact point.

The novel combination of features cause wiping action between the contacts to enhance electrical engagement.

The novel support clips permit the alignment of the IC package before contact is made with contacts 32.

The foregoing detailed description has been given for clearness of understanding only, and no unnecessary limitations should be understood therefrom, as some modifications will be obvious to those skilled in the art.

What is claimed is:

1. A device for connecting a leadless integrated circuit package to a printed circuit board, which comprises:

a. a square frame having a large center opening for receiving the integrated circuit package and having on each side defining the center opening a plurality of cavities which open out onto the inside face wall of the sides;

b. a plurality of S shaped contacts, each positioned in a cavity with the S curve portion vertically positioned therein, said contacts having an upper contact point projecting out through the cavity opening, said upper contact point adapted to engage a pad on the integrated circuit package which may be placed in the center opening in the frame, said contacts further having a lower contact point which is adapted to engage a pad on the printed circuit board thereby providing an electrical connection between the integrated circuit package and the printed circuit board; and c. a bracket positionable on top of the frame and a integrated circuit package which may be placed in the center opening, said bracket and frame having aligned means thereon to fasten the bracket to the frame thereby securing the integrating circuit package to the frame.

* * * * *

UNITED STATES PATENT OFFICE
CERTIFICATE OF CORRECTION

PATENT NO. : 3,877,064

DATED : April 8, 1975

INVENTOR(S) : WILLIAM SAMUEL SCHEINGOLD; HAROLD LAWRENCE PURDY; FRANK CHRISTIAN YOUNGFLEISH

It is certified that error appears in the above-identified patent and that said Letters Patent are hereby corrected as shown below:

On the title page "Lawrence Purdy" should be

---HAROLD LAWRENCE PURDY---.

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*